United States Patent [19]
Ueda et al.

[11] Patent Number: 5,554,824
[45] Date of Patent: Sep. 10, 1996

[54] IC PACKAGE AND PACKAGING METHOD FOR THE SAME

[75] Inventors: Masahiro Ueda; Shuichi Matsue, both of Itami, Japan

[73] Assignee: Mitsubishi Denki Kabushiki Kaisha, Tokyo, Japan

[21] Appl. No.: 997,756

[22] Filed: Dec. 30, 1992

[30] Foreign Application Priority Data

Jan. 7, 1992 [JP] Japan .................................. 4-000902

[51] Int. Cl.⁶ .................................................. H01L 23/02
[52] U.S. Cl. .......................................... 174/52.4; 257/704
[58] Field of Search ................... 174/52.1–52.4; 257/704, 710; 361/600, 709, 714, 718, 719, 736

[56] References Cited

U.S. PATENT DOCUMENTS

| | | |
|---|---|---|
| 4,153,988 | 5/1979 | Doo ............................................. 29/626 |
| 4,539,622 | 9/1985 | Akasaki ................................. 174/52.4 X |
| 4,881,116 | 11/1989 | Hidada et al. ............................... 357/74 |
| 5,036,163 | 7/1991 | Spielberger et al. .................... 174/52.4 |
| 5,311,048 | 5/1994 | Takahashi et al. ......................... 257/207 |
| 5,315,486 | 5/1994 | Fillion et al. ............................ 361/795 |

OTHER PUBLICATIONS

Hatano, "BICMOS Gate Arrays", NEC BIHO, 1990, vol. 43, No. 12, pp. 119–121.

Primary Examiner—Leo P. Picard
Assistant Examiner—Christopher Horgan
Attorney, Agent, or Firm—Lowe, Price, LeBlanc & Becker

[57] ABSTRACT

Plural kinds of metal wiring patterns on which a lid is to be put are formed on a package body. The wiring patterns connected to an IC chip are changed depending upon the size of the lid which is put on the package body. Either of an IC chip operated by a single power supply and an IC chip operated by positive and negative power supplies can be packaged without changing the wiring patterns in the package.

9 Claims, 9 Drawing Sheets

IC PACKAGE AND PACKAGING METHOD FOR THE SAME

BACKGROUND OF THE INVENTION

1. Field of the Invention

This invention relates to an IC package in which either of an IC chip operated by a single power supply and an IC chip operated by multiple power supplies can be packaged, and also to a packaging method for the same.

2. Description of the Related Art

Recently, owing to improvements in the process and the circuit technology, an LSI, which is an IC having a larger number of circuit elements, can be constructed by forming CMOS (Complementary Metal-Oxide semiconductor) devices using PMOS FETs and NMOS FETs and bipolar transistors on a single chip, thereby allowing the LSI to perform various functions. For example, in a BiCMOS gate array described in NEC GIHO, 1990, Vol. 43, No. 12, pp. 119–121 and having logic circuits composed of CMOS devices and bipolar transistors, the function of the LSI can be enhanced by forming ECL (Emitter Coupled Logic) devices which can operate at a high speed on a single chip, in addition to conventional TTL (Transistor Transistor Logic) devices.

Figure 1:
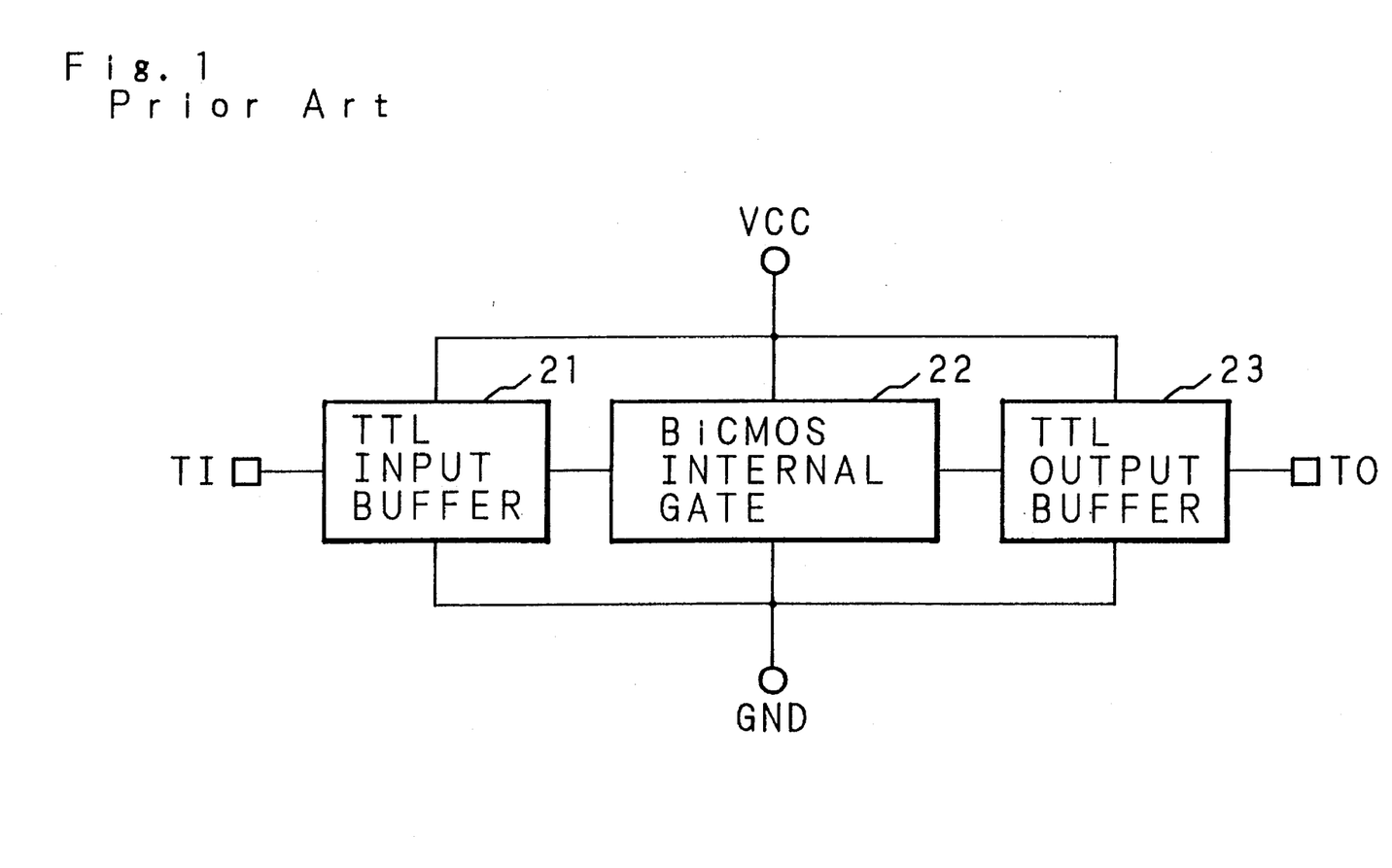
FIG. 1 is a diagram showing an example of an LSI chip constituting a TTL device with a single power supply.

FIG. 1 shows the structure of an example of gate array which can interface with input and output levels of a TTL device. In the gate array of FIG. 1, a TTL input buffer 21 which transmits the input of a TTL device to the internal of an LSI, an internal gate 22 which constitute a logic using BiCMOS (or CMOS) devices, and a TTL output buffer 23 which receives a signal from the internal gate 22 and outputs it at the TTL level are connected in series. The TTL input buffer 21 is coupled to a TTL input terminal TI, and the TTL output buffer 23 to a TTL output terminal TO. The LSI chip is connected to a positive power supply terminal VCC and also to a ground terminal GND, and a positive voltage (usually, 5 V) is applied to the LSI chip. In the thus configured gate array, a single power supply voltage is applied to the IC chip.

Figure 2:
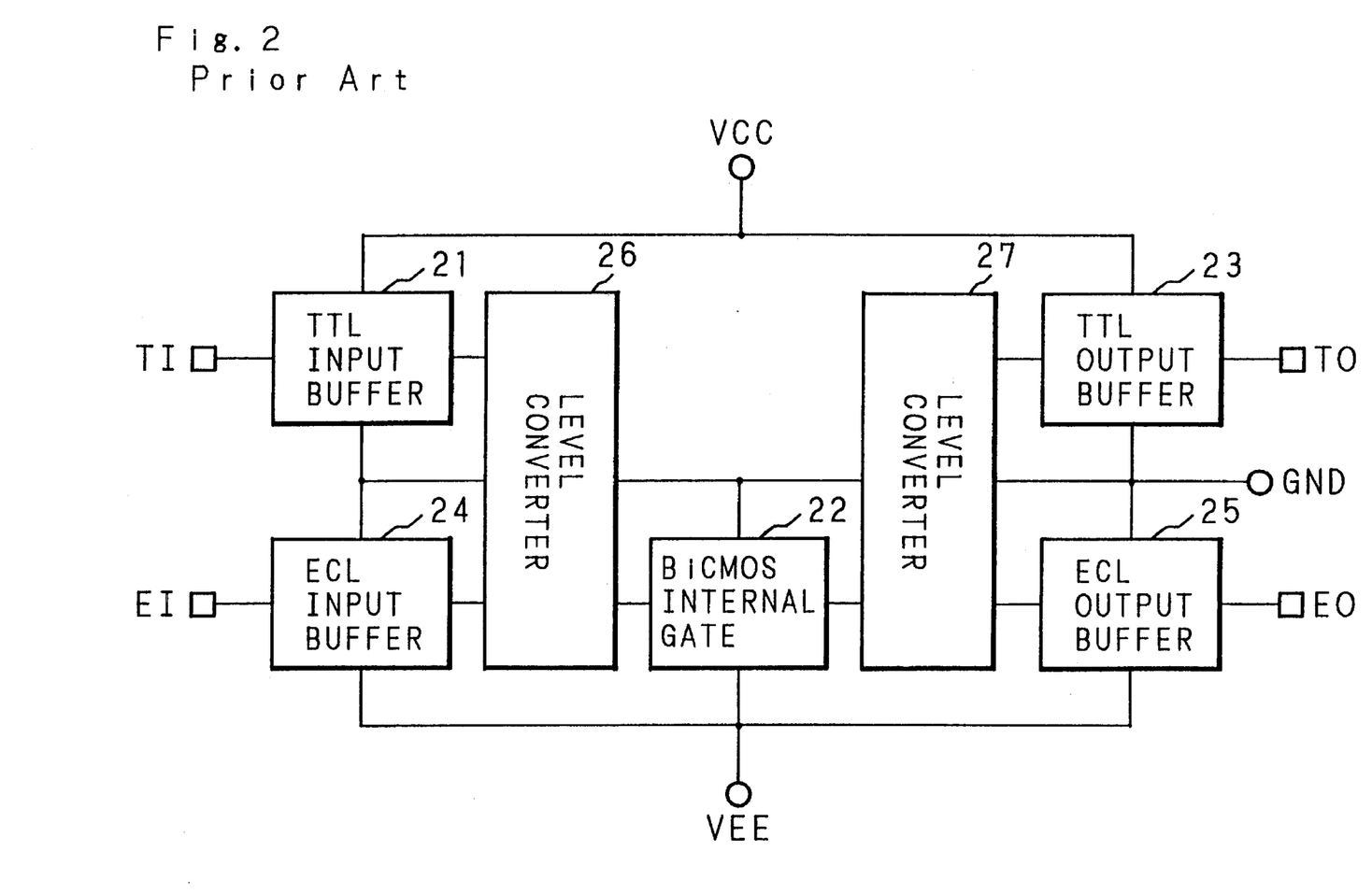
FIG. 2 is a diagram showing an example of an LSI chip constituting TTL and ECL device with positive and negative power supplies.

FIG. 2 shows the structure of an example of gate array which can interface with input and output levels of a TTL device and ECL device. In FIG. 2, parts designated by the same reference numerals as FIG. 1 are identical with those of FIG. 1. In the figure, 24 designates an ECL input buffer which is coupled to an ECL input terminal EI and transmits the input of an ECL device to the internal of an LSI, and 25 designates an ECL output buffer which is coupled to an ECL outputs terminal EO, receives a signal from the internal gate 22 and outputs it at the ECL level. Level converters 26 and 27 which convert the TTL to the logic level of the internal gate 22 are connected to the TTL input buffer 21 and the TTL output buffer 23, respectively. The LSI chip is connected also to a negative power supply terminal VEE, in addition to the positive power supply terminal VCC and the ground terminal GND, so that a negative voltage (usually, −5 V or −4.5 V) is applied together with the positive voltage to the LSI chip. In the thus configured gate array, two kinds of power supply voltages (positive and negative voltages) are applied to the IC chip.

Figure 3:
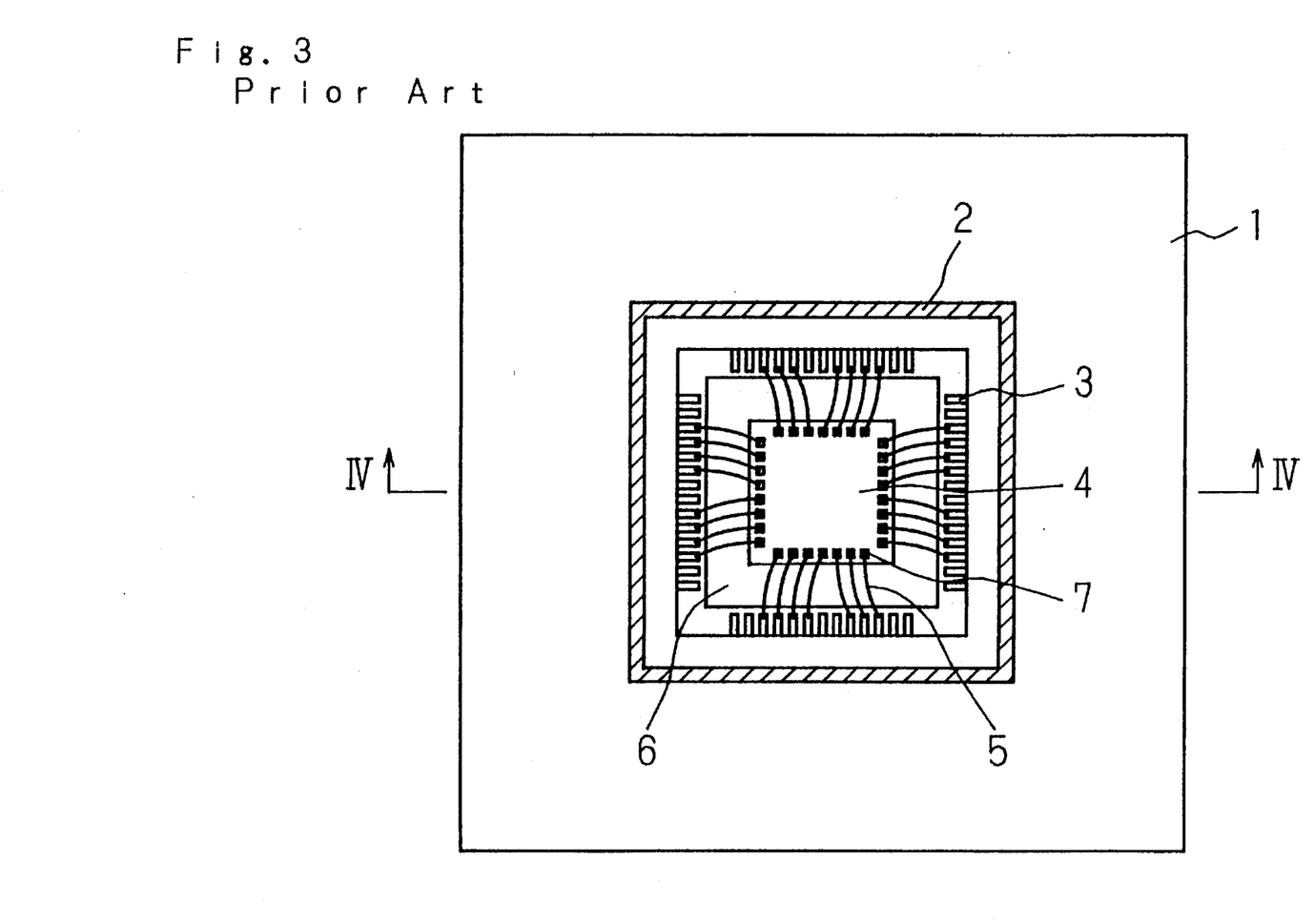
FIG. 3 is a plan view showing a prior art IC package.
Figure 4:
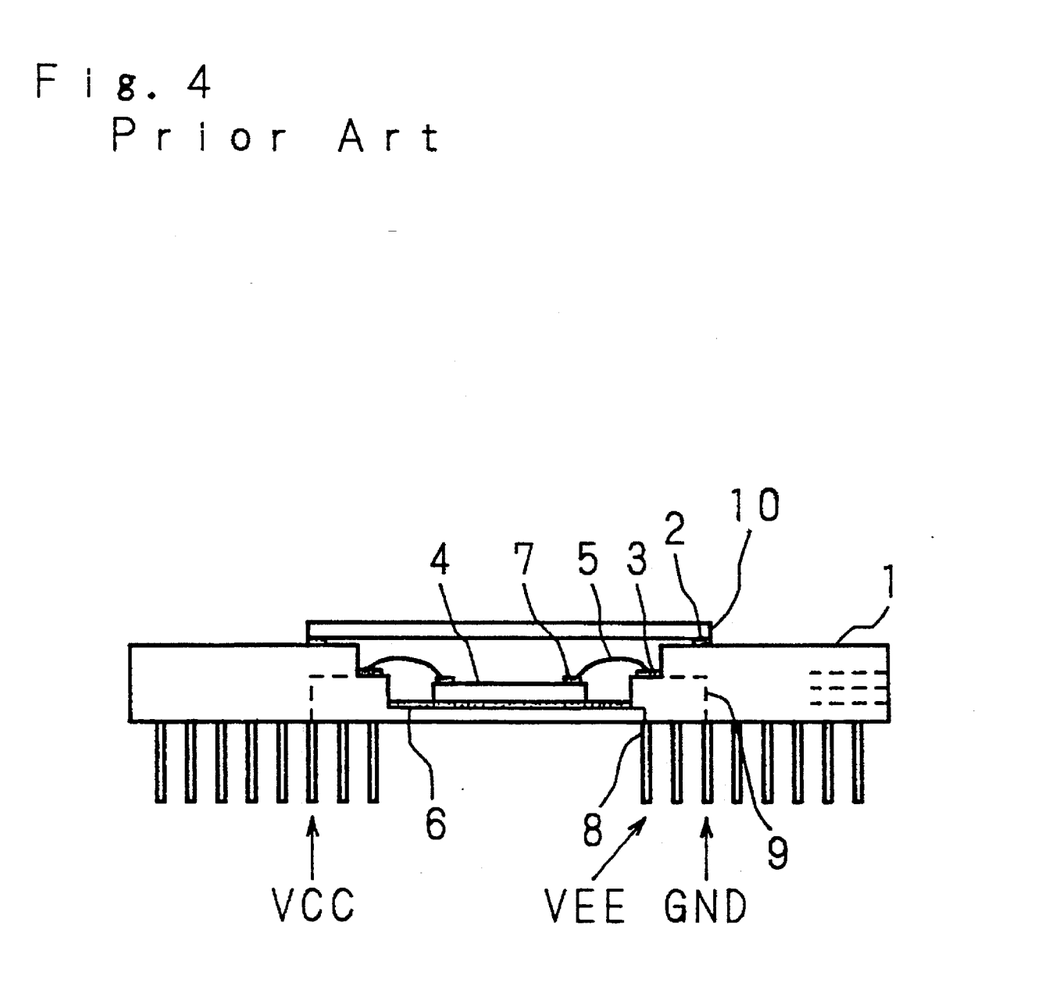
FIG. 4 is a sectional view taken along the line IV—IV of FIG. 3.

Both the configurations of FIGS. 1 and 2 can be obtained from the same master chip. In the field of gate arrays, generally, packages in which IC chips are to be packaged are common to all the IC chips. For example, it is known that an IC chip is packaged in a ceramic package which is made of fine ceramic, as shown in FIG. 3. FIG. 4 is a sectional view taken along the line IV—IV of FIG. 3.

In FIGS. 3 and 4, the numeral 1 designates a package body which is made of fine ceramic. On the surface of the package body 1, a ring-shaped metal wiring pattern 2 is formed. A lid 10 for sealing an IC chip 4 in the package is connected to the metal wiring pattern 2 by soldering or the like. In FIG. 3, the illustration of the lid 10 is omitted. In a die bonding region 6 which is the center region surrounded by the metal wiring pattern 2, the IC chip 4 having a number of pads 7 which are arranged in the periphery of the chip is bonded to the package body 1. A number of internal wiring electrodes 3 for the package are formed in the region between the metal wiring pattern 2 and the die bonding region 6, and connected with the corresponding pads 7 through wires 5, respectively. Many external leads 8 which respectively correspond to the positive power supply terminal VCC, the negative power supply terminal VEE, the ground terminal GND, etc. are drawn out from the package body 1. The connections between the external leads 8 for the positive power supply terminal VCC and ground terminal GND and the corresponding internal wiring electrodes 3, and between the external lead 8 for the negative power supply terminal VEE and the die bonding region 6 are performed by wirings 9 which are formed in the package body 1. In a package of a certain kind, generally, the power supply pins for the positive power supply terminal VCC, negative power supply terminal VEE and ground terminal GND are allocated to predetermined external lead positions.

When the package having the above-mentioned conventional structure is commonly used for packaging an IC chip with a single power supply such as shown in FIG. 1 and an IC chip with positive and negative power supplies, there arises the following inconvenience. In the case that the IC chip with a single power supply is packaged, the external lead 8 for the negative power supply terminal VEE is not used to become a useless lead. Moreover, the die bonding region 6, which is to be connected with the negative power supply terminal VEE in the case that the IC chip with positive and negative power supplies is packaged, must be connected with the ground terminal GND or the positive power supply terminal VCC so that the potential of the region is fixed. This requires a further wiring operation to be performed.

This inconvenience may be solved by separately preparing the package for the IC chip with a single power supply and that for the IC chip with positive and negative power supplies. However, this countermeasure poses a problem in that the packages to be prepared are so various that the cost for developing the packages becomes high.

SUMMARY OF THE INVENTION

It is the primary object of the invention to provide an IC package and a packaging method for the same in which power supply pins are effectively used both for an IC chip with a single power supply and for an IC chip with multiple power supplies, and either of an IC chip with a single power supply and an IC chip with multiple power supplies can be packaged using a common wiring.

In the IC package of the invention, two or more kinds of wiring patterns are formed on the package body, so that different voltages to be applied to IC chips are respectively applied to the two or more kinds of patterns. When the two kinds of patterns to which different voltages to be applied to IC chips are applied are short-circuited, the IC package can be used for an IC chip with a single power supply. In contrast, when the two kinds of wiring patterns are not short-circuited, different voltages can be respectively applied to the wiring patterns, thereby allowing the IC package to be used for an IC chip with multiple power supplies.

The wiring patterns are formed to be different from each other so that, when different kinds of lids are put on, various contacting states are obtained. Depending on the number of power supplies to be applied to an IC chip, one of lids having different sizes is selectively used. The provision of the above-mentioned short-circuit path can be controlled by selectively using one of two or more kinds of lids having different sizes. Therefore, the present IC package can be modified only by replacing the lid of the package with another one and without changing the wiring in the package, so that either of an IC chip with a single power supply and an IC chip with positive and negative power supplies is packaged in the package.

The above and further objects and features of the invention will more fully be apparent from the following detailed description with accompanying drawings.

DESCRIPTION OF THE PREFERRED EMBODIMENTS

Hereinafter, the invention will be specifically described with reference to the drawings showing its embodiments.

Figure 5:
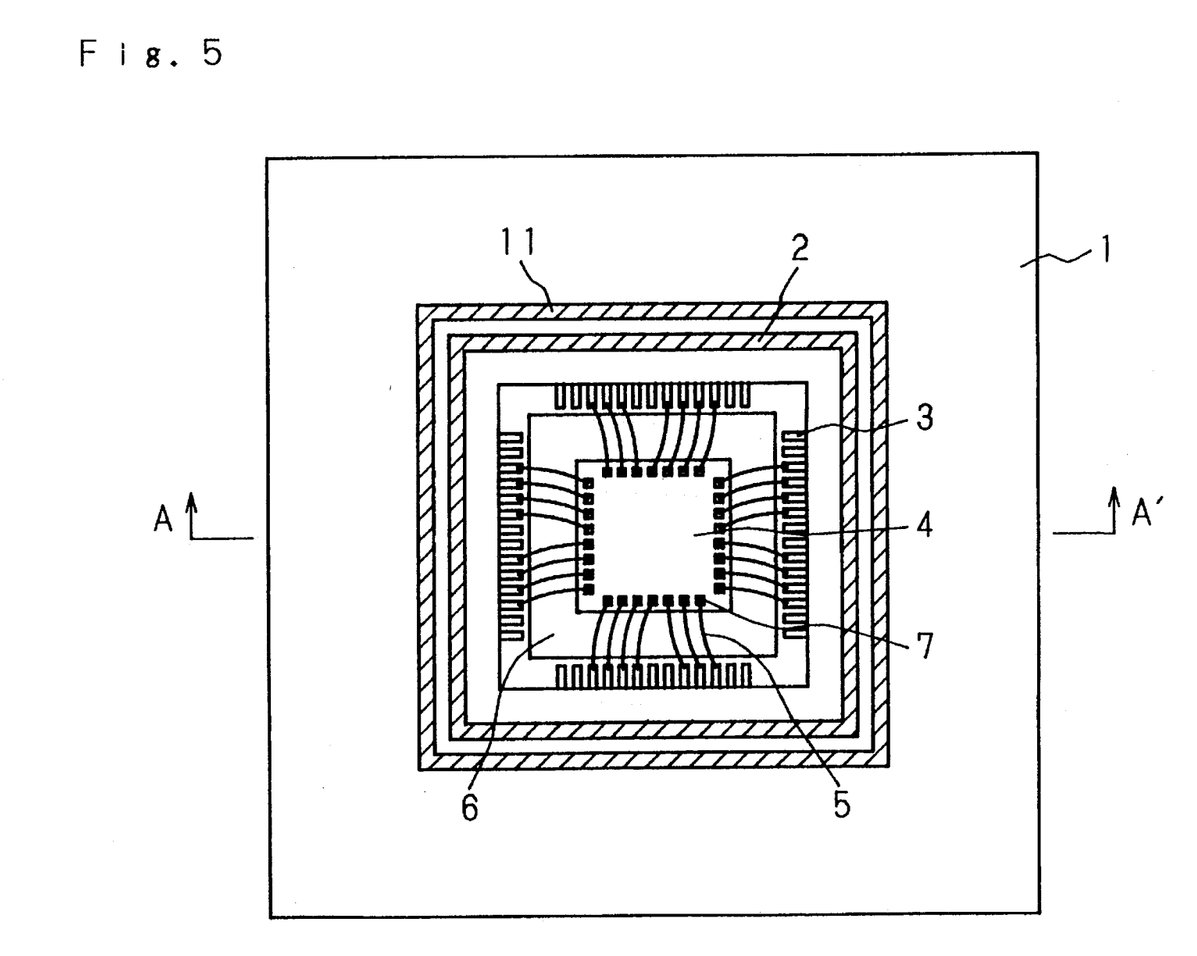
FIG. 5 is a plan view showing an IC package according to the invention.

FIG. 5 is a plan view showing an IC package according to the invention. In FIG. 5, the numeral 1 designates a package body which is made of fine ceramic. On the surface of the package body 1, a double wiring pattern is formed. Namely, two ring-shaped metal wiring patterns 2 and 11 are formed on the surface in such a manner that the metal wiring pattern 11 is formed in a region outside the metal wiring pattern 2 to surround it. In a die bonding region 6 which is the center region surrounded by the metal wiring pattern 2, an IC chip 4 having a number of pads 7 which are arranged in the periphery of the chip is bonded to the package body 1. A number of internal wiring electrodes 3 for the package are formed in the region between the metal wiring pattern 2 and the die bonding region 6, and connected with the corresponding pads 7 through wires 5, respectively. The IC package of FIG. 5 is different from the prior art IC package of FIG. 3 in that the other metal wiring pattern 11 is additionally formed outside the metal wiring pattern 2.

Figure 6:
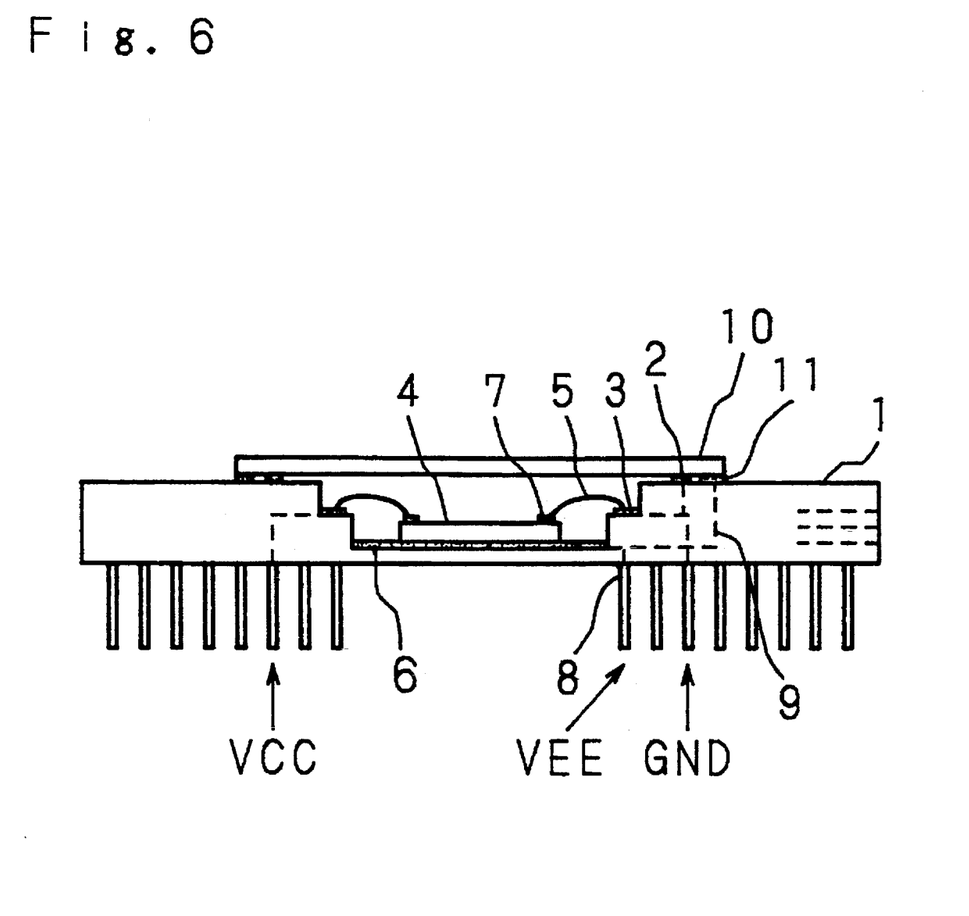
FIG. 6 is a sectional view taken along the line A–A' of FIG. 5 and showing the IC package in which an IC chip with a single power supply is packaged.
Figure 7:
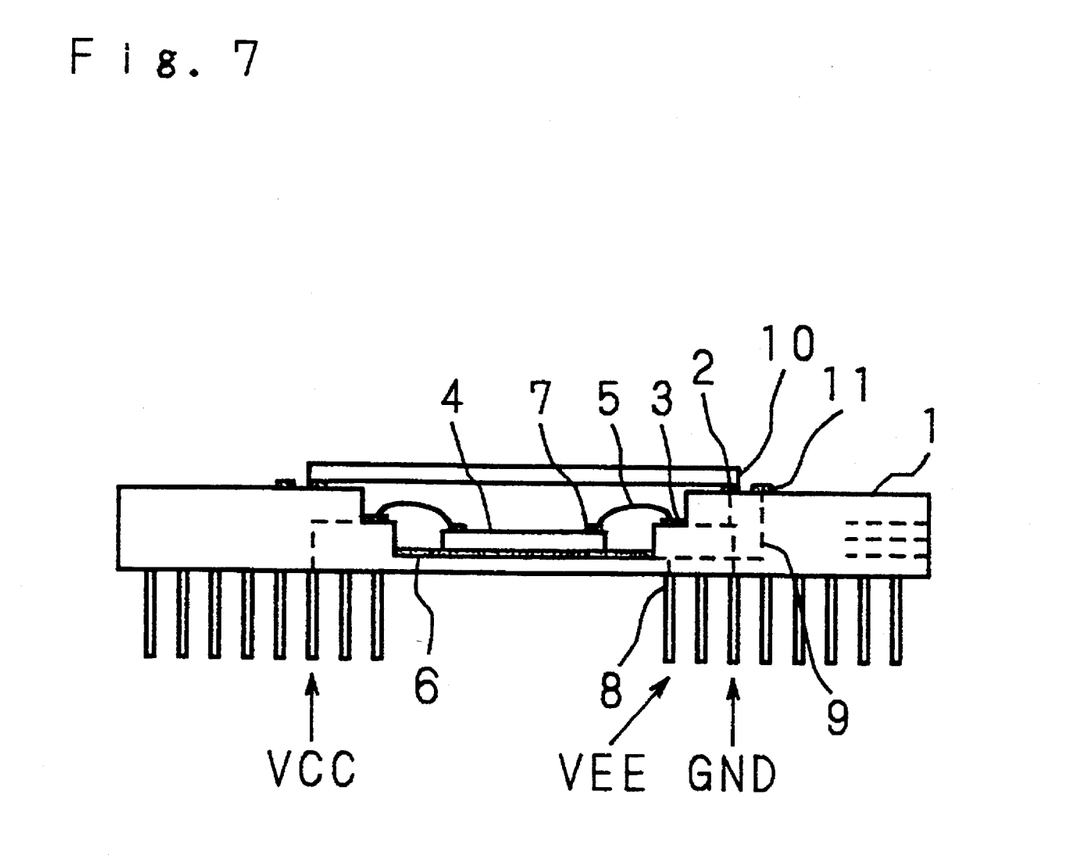
FIG. 7 is a sectional view taken along the line A–A' of FIG. 5 and showing the IC package in which an IC chip with positive and negative power supplies is packaged.

FIGS. 6 and 7 are sectional views taken along the line A–A' of FIG. 5. FIG. 6 shows the IC package in which an IC chip with a single power supply is packaged, and FIG. 7 shows the IC package in which an IC chip with positive and negative power supplies is packaged. In the IC packages of FIGS. 6 and 7, many external leads 8 which respectively correspond to a positive power supply terminal VCC, a negative power supply terminal VEE, a ground terminal GND, etc. are drawn from the package body 1. The external lead 8 for the positive power supply terminal VCC is connected with the corresponding internal wiring electrode 3 through a wiring 9 formed in the package body 1. The external lead 8 for the ground terminal GND is connected with the corresponding internal wiring electrode 3 and the inner metal wiring pattern 2 through a wiring 9 formed in the package body 1. The external lead 8 for the negative power supply terminal VEE is connected with the die bonding region 6 and the outer metal wiring pattern 11 through a wiring 9 formed in the package body 1. In the configuration of FIG. 6, a lid 10 for sealing the IC chip in the package is connected to the metal wiring patterns 2 and 11 by soldering or the like. By contrast, in the configuration of FIG. 7, a lid 10 which is one size smaller than the lid 10 used in the configuration of FIG. 6 is connected only to the metal wiring pattern 2 by soldering or the like. The configurations of FIGS. 6 and 7 are different from the prior art configuration of FIG. 4 in that the negative power supply terminal VEE and the ground terminal GND are respectively connected inside the package with the metal wiring patterns 11 and 2 formed on the surface of the package body 1.

Referring to FIGS. 6 and 7, the mechanism of packaging both the types of IC chips with a single power supply and with positive and negative power supplies will be described.

When the lid 10 which is sufficiently large for short-circuiting the metal wiring patterns 2 and 11 is used as shown in FIG. 6, the negative power supply terminal VEE and the ground terminal GND are short-circuited, thereby allowing this configuration to be used in the packaging of an IC chip with a single positive power supply.

In contrast, when the lid 10 which is small and covers only the metal wiring pattern 2 is used as shown in FIG. 7, the metal wiring pattern 11 connected with the negative power supply terminal VEE is electrically isolated from the ground terminal GND, thereby allowing this configuration to be used in the packaging of an IC chip with positive and negative power supplies.

In the above-described embodiment, the negative power supply terminal VEE and the ground terminal GND are short-circuited through the lid 10. Alternatively, the metal wiring pattern 11 may be connected with the positive power supply terminal VCC. In this case, an IC chip with a single negative power supply can be packaged in the package.

Next, with reference to FIGS. 8 and 9, another embodiment of the invention will be described. There are cases where in a certain occasion one positive voltage is applied to an IC chip and in another occasion two kinds of positive voltages are applied to the same IC chip. Even in such cases, according to the invention, both the voltage application states can be realized in a single IC package. An IC package useful in such cases has the same configuration as that of the above-described embodiment (see FIG. 5).

Figure 8:
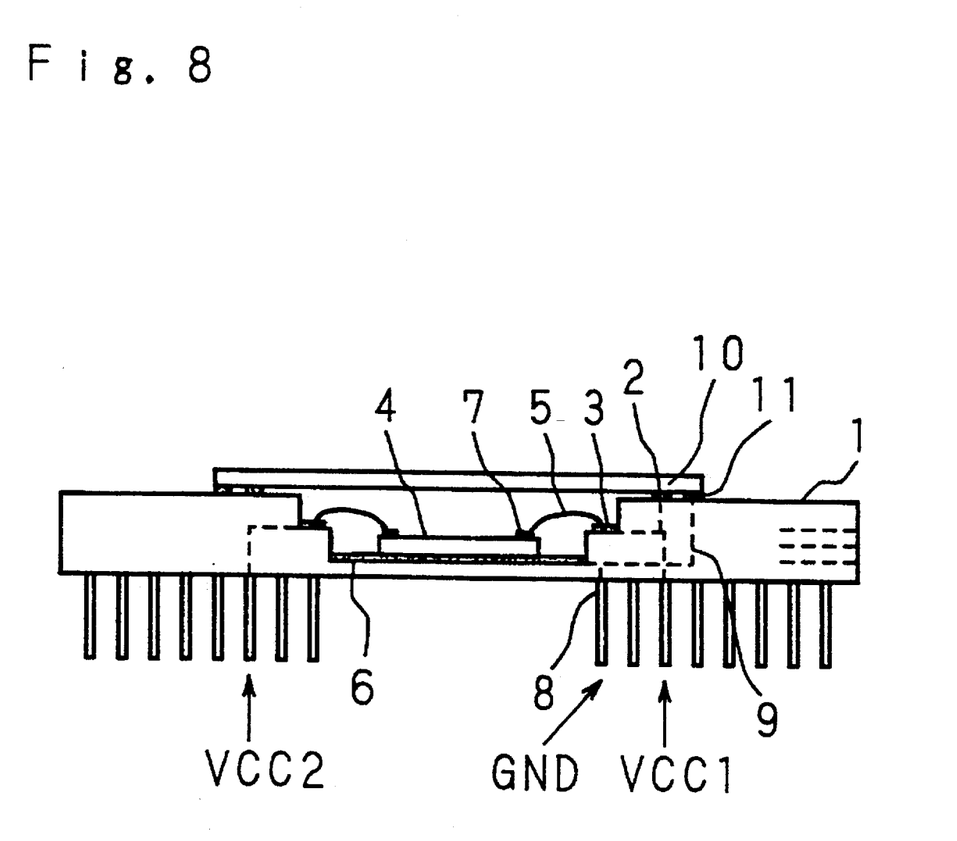
FIG. 8 is a sectional view taken along the line A–A' FIG. 5 and showing the IC package in which one positive voltage is applied to an IC chip.

When the lid 10 which is sufficiently large for short-circuiting the metal wiring patterns 2 and 11 is used as shown in FIG. 8, one positive power supply terminal VCC2 and the ground terminal GND are short-circuited, thereby allowing one positive voltage to be applied only through another positive power supply terminal VCC1 to the IC chip 4.

Figure 9:
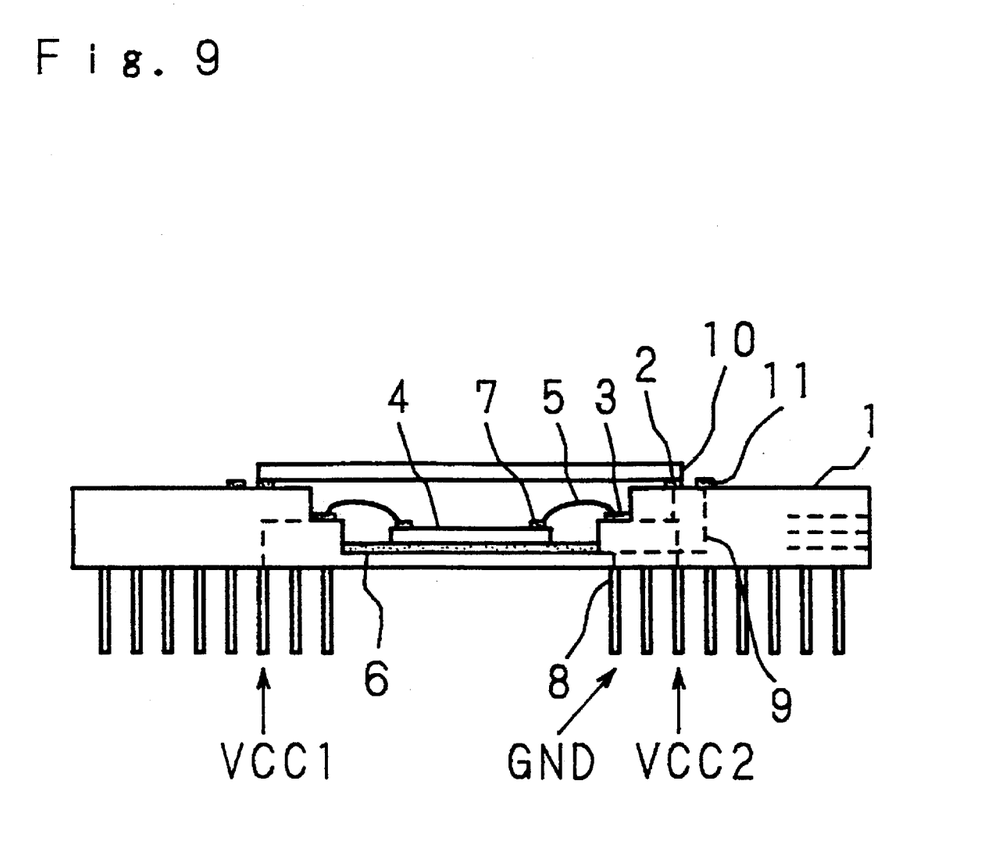
FIG. 9 is a sectional view taken along the line A–A' of FIG. 5 and showing the IC package in which two kinds of positive voltages are applied to an IC chip.

In contrast, when the lid 10 which is small and covers only the metal wiring pattern 2 is used as shown in FIG. 9, the metal wiring pattern 11 connected with the positive power supply terminal VCC2 is electrically isolated from the ground terminal GND, thereby allowing two kinds of positive voltages to be respectively applied through the positive power supply terminals VCC1 and VCC2 to the IC chip 4.

In the above-described embodiment, either of the application of one positive voltage and that of two kinds of positive voltages is performed. Alternatively, the positive power supply terminals may be replaced with negative power supply terminals. Also in this configuration, either of the application of one negative voltage and that of two kinds of negative voltages can be performed in the same manner.

As a modification of the above-described embodiments, the package may be so constructed that a further metal wiring pattern is formed in addition to the metal wiring patterns 2 and 11, at a position outside or inside the metal wiring pattern 11, and this additional metal wiring pattern is connected with the positive power supply terminal VCC. It is needless to say that in this case one of three kinds of lids having different sizes is selectively used.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An IC package for packaging an IC chip to which a voltage is to be applied, comprising:

a package body which has plural kinds of wiring patterns on a surface;

means for respectively applying voltages which are different in level from each other, to said wiring patterns;

means for applying said different voltages to said IC chip; and said IC package further includes one of plurality of lids which are to be put on said package body, said lids being different from each other in size.

2. An IC package according to claim 1, wherein said plural kinds of wiring patterns are different from each other in such a manner that said wiring patterns contact with said plurality of lids with different contacting states.

3. An IC package for packaging an IC chip to which a voltage is to be applied, comprising:

a package body which has plural kinds of wiring patterns on a surface; and a plurality of lids which are to be put on said package body so as to contact with said wiring patterns with different contacting states, thereby applying different voltages to said wiring patterns.

4. An IC package for packaging an IC chip to which a voltage is to be applied, comprising:

a package body which has plural kinds of wiring patterns on a surface;

an external lead which is drawn out from said package body and corresponds to a positive power supply terminal;

an external lead which is drawn out from said package body and corresponds to a negative power supply terminal;

an external lead which is drawn out from said package body and corresponds to a ground terminal; and a plurality of lids which are to be put on said package body, said lids being different from each other in size.

5. An IC package according to claim 4, wherein said plural kinds of wiring patterns are different from each other in such a manner that said wiring patterns contact with said plurality of lids with different contacting states.

6. An IC package for packaging an IC chip to which a voltage is to be applied, comprising:

a package body which has plural kinds of wiring patterns on a surface;

an external lead which is drawn out from said package body and corresponds to a first positive power supply terminal;

an external lead which is drawn out from said package body and corresponds to a second positive power supply terminal;

an external lead which is drawn out from said package body and corresponds to a ground terminal; and a plurality of lids which are to be put on said package body, said lids being different from each other in size.

7. An IC package according to claim 6, wherein said plural kinds of wiring patterns are different from each other in such a manner that said wiring patterns contact with said plurality of lids with different contacting states.

8. An IC package for packaging an IC chip to which a voltage is to be applied, comprising:

a package body which has plural kinds of wiring patterns on a surface;

a first external lead which is drawn out from said package body and corresponds to a positive power supply terminal;

a second external lead which is drawn out from said package body and corresponds to a negative power supply terminal;

a third external lead which is drawn out from said package body and corresponds to a ground terminal;

a first lid which is to be put on said package body so that said second external lead and said third external lead are short-circuited; and a second lid which is to be put on said package body so that said second external lead and said third external lead are not short-circuited.

9. An IC package for packaging an IC chip to which a voltage is to be applied, comprising:

a package body which has plural kinds of wiring patterns on a surface;

a first external lead which is drawn out from said package body and corresponds to a first positive power supply terminal;

a second external lead which is drawn out from said package body and correspond to a second positive power supply terminal;

a third external lead which is drawn out from said package body and corresponds to a ground terminal;

a first lid which is to be put on said package body so that said second external lead and said third external lead are short-circuited; and a second lid which is to be put on said package body so that said second external lead and said third external lead are not short-circuited.

* * * * *